US012684745B2

(12) United States Patent
Moser et al.

(10) Patent No.: US 12,684,745 B2
(45) Date of Patent: Jul. 14, 2026

(54) COOLING DEVICE HAVING A FAN AND HOUSING HAVING A COOLING DEVICE OF THIS TYPE

(71) Applicant: Fronius International GmbH, Pettenbach (AT)

(72) Inventors: Peter Moser, Pettenbach (AT); Bernhard Huemer, Pettenbach (AT)

(73) Assignee: Fronius International GmbH, Pettenbach (AT)

( * ) Notice: Subject to any disclaimer, the term of this patent is extended or adjusted under 35 U.S.C. 154(b) by 222 days.

(21) Appl. No.: 18/694,122

(22) PCT Filed: Jun. 16, 2023

(86) PCT No.: PCT/EP2023/066196
§ 371 (c)(1),
(2) Date: Mar. 21, 2024

(87) PCT Pub. No.: WO2023/242382
PCT Pub. Date: Dec. 21, 2023

(65) Prior Publication Data
US 2024/0389280 A1 Nov. 21, 2024

(30) Foreign Application Priority Data
Jun. 17, 2022 (EP) ..................................... 22179505

(51) Int. Cl.
*H05K 7/20* (2006.01)
*H02K 5/10* (2006.01)
*H02K 7/14* (2006.01)
(52) U.S. Cl.
CPC ........... *H05K 7/20909* (2013.01); *H02K 5/10* (2013.01); *H02K 7/14* (2013.01)

(58) Field of Classification Search
CPC ......... H05K 7/20909; H02K 5/10; H02K 7/14
(Continued)

(56) References Cited

U.S. PATENT DOCUMENTS 5,288,203 A * 2/1994 Thomas ................ H01L 23/467
415/214.1
5,437,327 A 8/1995 Chiou
(Continued)

FOREIGN PATENT DOCUMENTS

AT 515828 B1 2/2022
DE 9416186 U1 * 4/1995
(Continued)

OTHER PUBLICATIONS

International Search Report in PCT/EP2023/066196, mailed Sep. 7, 2023.
(Continued)

*Primary Examiner* — Anatoly Vortman
(74) *Attorney, Agent, or Firm* — Collard & Roe, P.C.

(57) ABSTRACT

A cooling device for cooling power electronic components arranged in a housing includes a heat sink and a fan having an electric motor with a rotor and rotor blades non-rotatably connected to the rotor, wherein the motor is arranged in a motor housing and is connected to a cable, and the heat sink has cooling fins and a cavity for receiving the fan, wherein a recess arranged in the cavity of the heat sink receives the motor housing of the fan. The motor housing of the fan has a peripheral seal and the cable and a fastening element are arranged on the side of the motor housing facing away from the rotor blades, wherein a receptacle for the fastening element and a passage for the cable are arranged in the recess.

14 Claims, 8 Drawing Sheets

(58) Field of Classification Search
USPC ...................................................... 361/679.47
See application file for complete search history.

(56) References Cited

U.S. PATENT DOCUMENTS

| | | | | |
|---|---|---|---|---|
| 5,522,700 | A * | 6/1996 | Hong | F04D 29/582 |
| | | | | 165/122 |
| 5,650,912 | A * | 7/1997 | Katsui | H01L 23/467 |
| | | | | 361/679.48 |
| 5,661,638 | A * | 8/1997 | Mira | H01L 23/467 |
| | | | | 165/126 |
| 5,787,971 | A * | 8/1998 | Dodson | H01L 23/467 |
| | | | | 257/E23.099 |
| 5,927,385 | A * | 7/1999 | Yeh | H01L 23/467 |
| | | | | 165/185 |
| 5,943,209 | A * | 8/1999 | Liu | H01L 23/467 |
| | | | | 165/185 |
| 5,946,192 | A * | 8/1999 | Ishigami | H05K 7/20418 |
| | | | | 257/727 |
| 5,997,267 | A * | 12/1999 | Lee | H02K 11/33 |
| | | | | 417/423.7 |
| 6,170,563 | B1 * | 1/2001 | Hsieh | F28F 3/04 |
| | | | | 165/122 |
| 6,401,808 | B1 * | 6/2002 | Hanzlik | H01L 23/467 |
| | | | | 257/E23.099 |
| 6,404,634 | B1 * | 6/2002 | Mann | H05K 7/1061 |
| | | | | 257/722 |
| 6,466,444 | B2 * | 10/2002 | Cheung | F28F 3/02 |
| | | | | 174/16.3 |
| 7,123,483 | B2 * | 10/2006 | Otsuki | H01L 23/467 |
| | | | | 257/722 |
| 7,133,288 | B2 * | 11/2006 | DelPrete | H01L 23/4093 |
| | | | | 257/E23.099 |
| 7,193,849 | B2 * | 3/2007 | Xu | F04D 29/582 |
| | | | | 257/E23.099 |
| 7,359,196 | B2 * | 4/2008 | Foster, Sr. | H01L 23/467 |
| | | | | 165/104.34 |
| 7,789,126 | B2 * | 9/2010 | Lofland | H01L 23/467 |
| | | | | 415/176 |
| 8,050,035 | B2 * | 11/2011 | Yu | H01L 23/467 |
| | | | | 361/709 |
| 9,869,321 | B2 * | 1/2018 | Ishihara | H02K 5/12 |
| 10,104,808 | B2 | 10/2018 | Scharinger et al. | |
| 2008/0078527 | A1 * | 4/2008 | Lofland | H01L 23/467 |
| | | | | 257/E23.099 |
| 2010/0051232 | A1 | 3/2010 | Zhao et al. | |
| 2013/0248155 | A1 | 9/2013 | Yuan | |
| 2018/0103559 | A1 | 4/2018 | Park | |

FOREIGN PATENT DOCUMENTS

| | | | |
|---|---|---|---|
| DE | 10 2018 207 985 | A1 | 12/2018 |
| EP | 2 068 003 | A2 | 6/2009 |

OTHER PUBLICATIONS

European Search Report dated Dec. 8, 2022 in European Application No. 22179505.7, with English Translation.
English translation of the International Preliminary Report on Patentability and Written Opinion of the International Searching Authority in PCT/EP2023/066196, mailed Dec. 26, 2024.

* cited by examiner

COOLING DEVICE HAVING A FAN AND HOUSING HAVING A COOLING DEVICE OF THIS TYPE

CROSS REFERENCE TO RELATED APPLICATIONS

This application is the National Stage of PCT/EP2023/066196 filed on Jun. 16, 2023, which claims priority under 35 U.S.C. § 119 of European Application No. 22179505.7 filed on Jun. 17, 2022, the disclosure of which is incorporated by reference. The international application under PCT article 21(2) was not published in English.

BACKGROUND OF THE INVENTION

1. Field of the Invention

The invention relates to a cooling device for cooling power electronic components arranged in a housing, comprising a heat sink and a fan with an electric motor with a rotor and rotor blades which are non-rotatably connected to the rotor, wherein the motor is arranged in a motor housing and is connected to a cable for supplying electrical energy, and the heat sink has a plurality of cooling fins and a cavity for receiving the fan, wherein a recess arranged in the cavity of the heat sink receives the motor housing of the fan.

Finally, the invention relates to a housing for receiving power electronics components, in particular an inverter housing, having a housing front and at least one rear housing part.

2. Description of the Related Art

In particular, power electronic components of various electronic devices generate dissipated heat. Examples of such devices are inverters for photovoltaic systems, welding power sources, or even battery chargers. In order to ensure trouble-free operation of such devices and a long service life, heat must be removed efficiently. This is usually done via heat sinks in combination with fans.

For example, AT 515 828 B1 describes a cooling device for cooling power electronics components arranged in a housing and an inverter housing with such a cooling device, which enables an improved cooling effect with a space-saving and compact design at the same time due to a special arrangement of an axial fan in a cavity of the heat sink with specially arranged cooling fins.

US 2018/0103559 A1 also describes a cooling device of the type in question.

The fan, if necessary together with an air guide ring for directing the cooling air, is usually fastened to the heat sink or a housing part by means of screws via a plurality of cross struts. In addition, the cable for supplying the motor of the fan with electrical energy is usually laid along one of the cross struts. Such a construction is shown, for example, in US 2010/0051232 A1.

Apart from the high assembly effort, the cross struts and, possibly, the cable generate acoustic emissions when the fan rotates. Similar to a helicopter rotor, which produces typical noises for the helicopter when sweeping over the rear structure of the helicopter, a conventional fan produces so-called sweeping noises when sweeping over the cross struts. In order to avoid or at least reduce interferences from these noise emissions, additional soundproofing measures are required, which in turn can have a negative effect on the cooling of the power electronics components.

SUMMARY OF THE INVENTION

The object of the present invention is therefore to provide an above-mentioned cooling device with a fan, and a housing with such a cooling device, that minimize the acoustic emissions originating from the fan. At the same time, the assembly effort for the fan should be kept as low as possible. Disadvantages of known cooling devices are to be avoided or at least reduced.

The object according to the invention is achieved by a cooling device of the above-mentioned type, wherein the motor housing of the fan has a peripheral seal, and the cable and a fastening element are arranged on the side of the motor housing facing away from the rotor blades, wherein a receptacle for the fastening element and a passage for the cable are arranged in the recess. The heat sink of the cooling device thus has a recess in the cavity for the fan, into which the motor housing fits. The fastening element located on the motor housing is arranged in the receptacle arranged in the recess and ensures the corresponding fastening of the fan in the heat sink. Finally, the cable, which is also arranged on the underside of the motor housing, may be passed through the passage provided in the recess of the heat sink to supply the motor of the fan with electrical energy, thereby keeping the cable away from the rotor blades where it could cause acoustic emissions as the rotor blades sweep over it. Thus, the fan can be quickly and easily attached to the heat sink of the cooling device without cross struts or other elements that could lead to sweeping noises. When the motor housing is positioned in the recess of the cavity of the heat sink, it is automatically sealed against the heat sink by the seal provided on the motor housing. As a result, the assembly and disassembly effort can be reduced. The above-mentioned acoustic emissions due to the sweeping of the rotor blades over cross struts or the cable can thus be effectively prevented or reduced and the total noise emissions originating from the fan can be reduced. In addition, the cable of the fan does not need to be routed and sealed through other components, in particular the heat sink, to the corresponding electronic components via a separate seal; instead this is done on the side of the motor housing facing away from the rotor blades. The sealing of the power electronic components to be cooled from the surroundings, which is often necessary in accordance with the required protection class, is further achieved or facilitated by the peripheral seal arranged in the motor housing. The present cooling device with the fan is simple and inexpensive to manufacture.

Preferably, the fan motor housing is substantially cylindrical. This simplifies the sealing against the mounting element, for example the heat sink, and also facilitates the fan's placement in a corresponding recess within the element, for example the heat sink, since the orientation of the fan or motor housing with respect to the recess in the heat sink is largely arbitrary. But of course, in addition to such a cylindrical design, other asymmetrical shapes of the motor housing of the fan are also conceivable.

The seal of the motor housing of the fan can be formed by at least one O-ring arranged in each case in a groove on the preferably cylindrical motor housing. The O-ring is formed of a suitable elastic material, such as silicone. The seal ensures the sealing of the electronics elements from the surroundings when assembling the fan, in particular on the heat sink of the cooling device.

Likewise, the seal of the motor housing of the fan may be formed by at least one lamellar seal on the cylindrical motor housing. The lamellar seal is made of a suitable elastic plastic. If the motor housing of the fan is made of plastic, the lamellar seal can also be integrated in a particularly suitable manner already during the production of the motor housing and can be produced, for example, in a single-component or multi-component injection moulding process.

The fastening element on the motor housing of the fan is preferably formed by a latching element, preferably an elastic latching pin. As a result, a tool-free assembly and preferably disassembly of the fan from the element to be connected, preferably the heat sink, can be achieved. The fastening element is preferably formed by an elastic latching pin with corresponding barbs, which can be easily and quickly arranged and anchored in a bore provided for this purpose by pulling the latching pin arranged on the motor housing through the bore until the barbs latch correspondingly, so that a secure hold of the fan in the respective element, preferably a heat sink, is ensured. By pressing the latching pin in the direction of the motor housing, a release of the fan from the heat sink can preferably be achieved without the use of a tool.

Likewise, the fastening element can be formed by a fastening screw. This increases the effort required in the assembly and disassembly of the fan compared to an above-mentioned latching element since a corresponding tool, for example a screwdriver, is also required. In contrast to conventional assemblies using several fastening screws, the effort is nevertheless reduced, since only one fastening screw has to be attached or removed. Through the arrangement of the fastening screw on the motor housing it is ensured that the assembly of the fan does not lead to any acoustic emissions during the rotation of the rotor blades.

When the cable is arranged next to the fastening element, it may simply be arranged adjacent to the fastening element through the appropriately designed receptacle for the fastening element on the element to which the fan is to be attached, particularly the heat sink. In the case of a bore for receiving the fastening element, in particular the latching pin, an additional channel for the cable can be placed next to the bore, resulting in a receptacle for the fastening element and the cable in the recess of the heat sink in the form of a keyhole.

Preferably, an air guide ring surrounding the rotor blades is provided. By means of such a usually cylindrical air guide ring, the cooling air sucked in by the fan, in particular the axial fan, can be channeled in a targeted manner and directed to the regions of the heat sink that are to be significantly cooled.

The receptacle for the fastening element is preferably formed by a bore. Such a bore can be produced particularly quickly and easily and is used for easily receiving the fastening element formed by a latching element or also a fastening screw on the motor housing.

The passage for the cable is also preferably formed by a bore, which can be produced particularly quickly and easily. The passage for the cable and the receptacle for the fastening element can also be produced together, so that, for example, an opening for the fastening element and the cable in the form of a keyhole (see above) is obtained.

Finally, the object according to the invention is also achieved by a housing as mentioned above for receiving power electronics components, in particular an inverter housing, wherein an above-mentioned cooling device is provided behind the housing front, wherein an opening for sucking in ambient air is arranged in the housing front.

Reference is made to the above descriptions of the fan and the cooling device with regard to the advantages which can be achieved thereby.

A grille or other protection against contact with the fan may be arranged in the opening of the housing front. Instead of a grille or the like, the cooling air can also be supplied at suitable points of the housing, so that perhaps no grille or other protection against contact is necessary at all.

When the fan air guide ring is located or integrated in the housing front, a simple and quick assembly of the air guide ring can be achieved automatically when assembling the housing. Of course, the air guide ring can also be formed by a specific part, which is correspondingly arranged around the fan in order to be able to guide the cooling air accordingly.

BRIEF DESCRIPTION OF THE DRAWINGS

The present invention is further explained with reference to the appended drawings, in which.

DETAILED DESCRIPTION OF THE PREFERRED EMBODIMENTS

Figure 1:
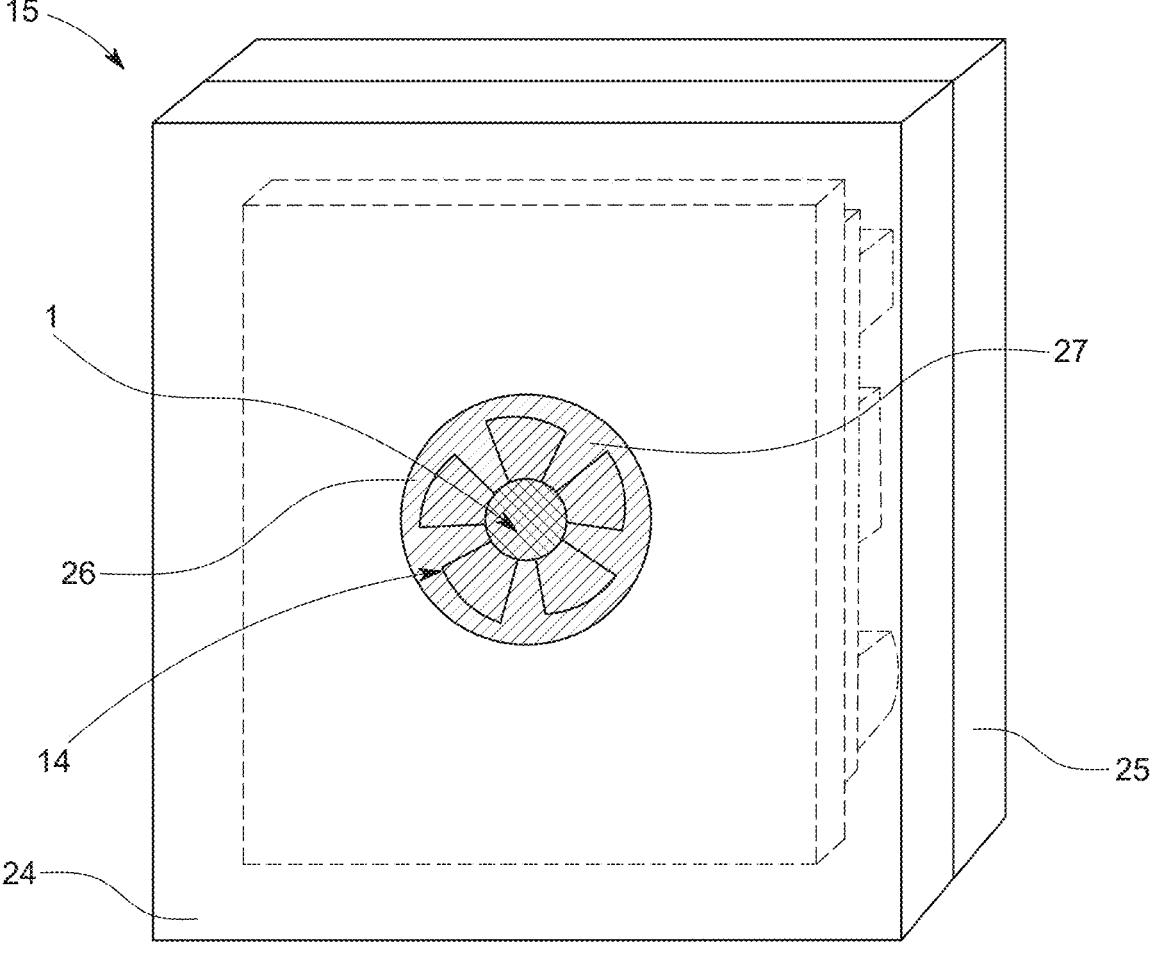
FIG. 1 shows a schematic view of a housing for receiving power electronics components.

FIG. 1 shows a schematic view of a housing 15 for receiving power electronics components, for example an inverter housing for the inverter of a photovoltaic system. The housing 15 consists of a front part, the housing front 24, and a rear housing part 25. Arranged behind the housing front 24 is a cooling device 14 (see FIG. 2) with a fan 1 (see FIG. 5). An opening 26 for sucking in ambient air is arranged in the housing front 24. Preferably, a grille 27 or other protection against contact is provided in the opening 26. The position of the opening 26 is correspondingly adapted to the cooling device 14 arranged behind the housing front 24. In particular, the fan 1 of the cooling device 14 is arranged behind the opening 26. In the illustrated example, the opening 26 is arranged centrally on the housing front 24. Instead of an opening 26 arranged in this way above the fan 1 of the cooling device 14, slots or the like can also be placed at other points of the housing front 24 for sucking in the ambient air (not shown). The power electronics components to be cooled are arranged behind the heat sink 16 of the cooling device 14 (not shown or only indicated by the dashed lines). The cooling air is discharged via suitably arranged slots or the like in the housing front 24 or the rear housing part 25 (not shown). Of course, the housing 15 may also consist of a plurality of housing parts and may have a different cuboidal shape from that shown.

Figure 2:
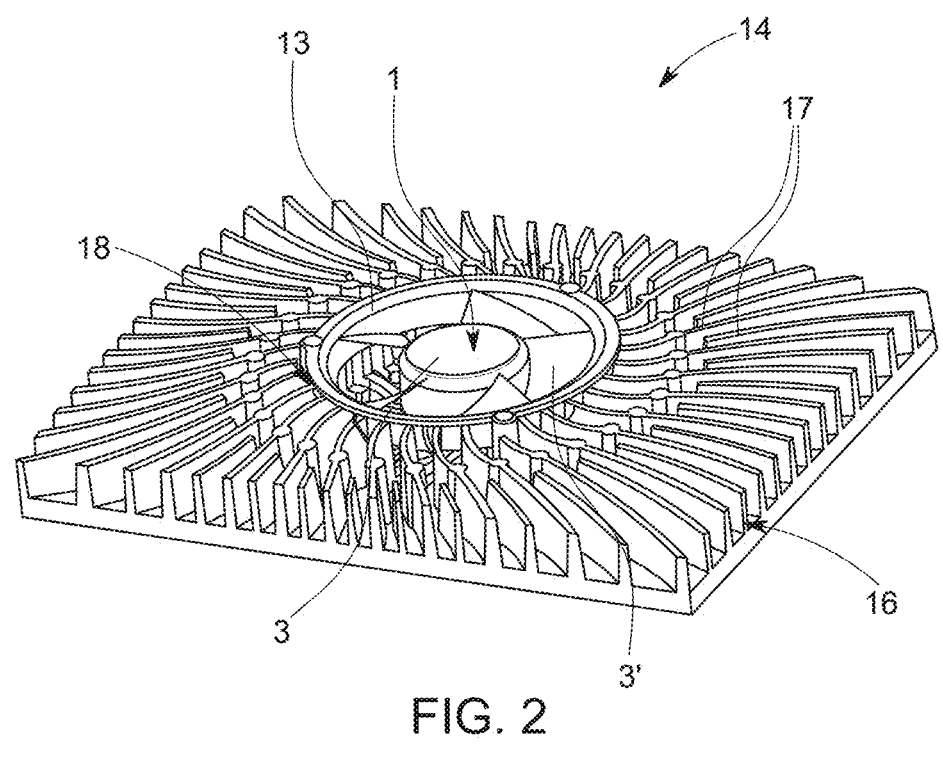
FIG. 2 shows a view of a cooling device with a fan for cooling power electronics components according to the prior art which are arranged in a housing.

FIG. 2 shows a view of a cooling device 14 for cooling power electronics components according to the prior art which are arranged in a housing 15 (see FIG. 1). The cooling device 14 includes a combination of a heat sink 16 with an integrated fan 1. The fan 1 is arranged in a cavity 18 in the heat sink 16. The heat sink 16 comprises a row of cooling fins 17, which here are arranged substantially radially around the cavity 18 for the fan 1. In addition to increasing the surface area, this arrangement brings about a division of the cooling air flow and thus an improved cooling effect. The fan 1 is preferably placed at a central point of the heat sink 16 in order to achieve an even distribution of the ambient air sucked in over the entire surface of the heat sink 16. Usually, an air guide ring 13 is also arranged around the fan, an intermediate space being formed between its lower edge and the base surface of the heat sink 16. This intermediate space makes it possible for the air flow sucked in from above to be discharged laterally between the cooling fins 17. Usually, the fan 1 is fastened to the heat sink 16 by means of cross struts with the aid of corresponding fastening screws. If the rotor blades 3 of the fan 1 pass the cross struts during operation of the fan, disturbing acoustic emissions, so-called sweeping noises, are produced, which are to be avoided or at least reduced according to the invention.

Figure 3:
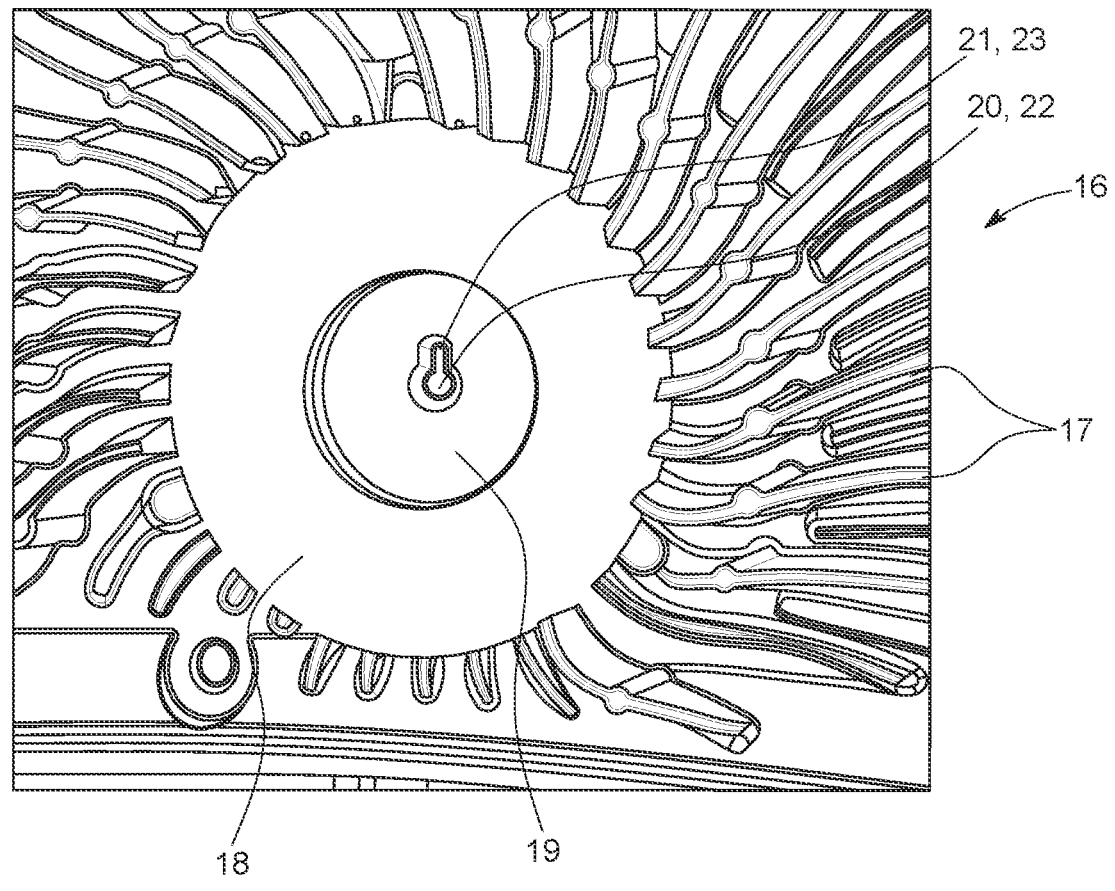
FIG. 3 shows a view of the heat sink of a cooling device, which is designed to receive a fan.
Figure 7:
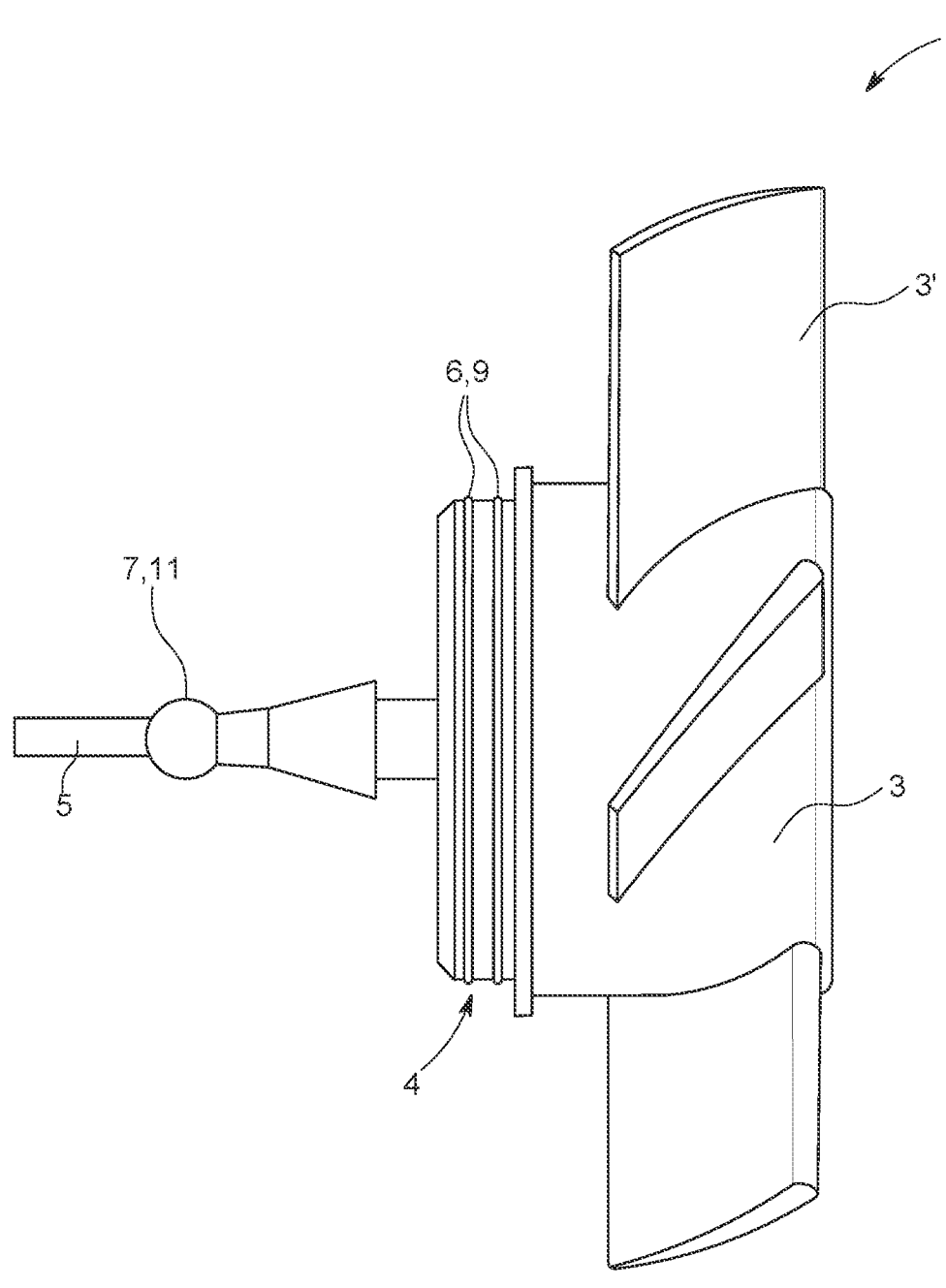
FIG. 7 shows a side view of a fan of the cooling device.

FIG. 3 shows a view of the heat sink 16 of a cooling device 14 which receives a fan 1 (see FIG. 7). The heat sink 16 has a plurality of cooling fins 17 and a cavity 18 for receiving the fan 1 (see FIG. 2). A recess 19 arranged in the cavity 18 of the heat sink 16 receives the motor housing 4 of the fan 1. If the motor housing 4 is cylindrical, the recess 19 is also cylindrical so that the motor housing 4 of the fan 1 can be received and fastened therein. To secure the fan 1 in the heat sink 16, a receptacle 20 for the fastening element 7 of the fan 1 is provided in the recess 19, and a passage 21 for the cable 5 of the fan 1 is also arranged. Preferably, the receptacle 20 for the fastening element 7 is formed by a cylindrical recess 22 and the passage 21 for the cable 5 is formed by a bore 23. If the cylindrical recess 22 and the bore 23 are arranged directly next to one another or overlapping, an opening in the form of a keyhole results for both the fastening element 7 and the cable 5 of the fan 1. Because both the attachment of the fan 1 and the passage of the cable 5 downwards through the heat sink 16 are necessary, no further fastening elements are required to attach the fan 1 to the heat sink 16 and the cable 5 does not run near the rotor blades 3 of the fan 1. As a result, sweeping noises during operation of the fan 1 can be avoided and the acoustic emissions of the fan can be reduced. In addition, the design of the fan 1, on the one hand, and of the heat sink 16, on the other hand, enables a quick and simple assembly and disassembly of the fan 1 on the heat sink 16, preferably without the use of tools.

Figure 4:
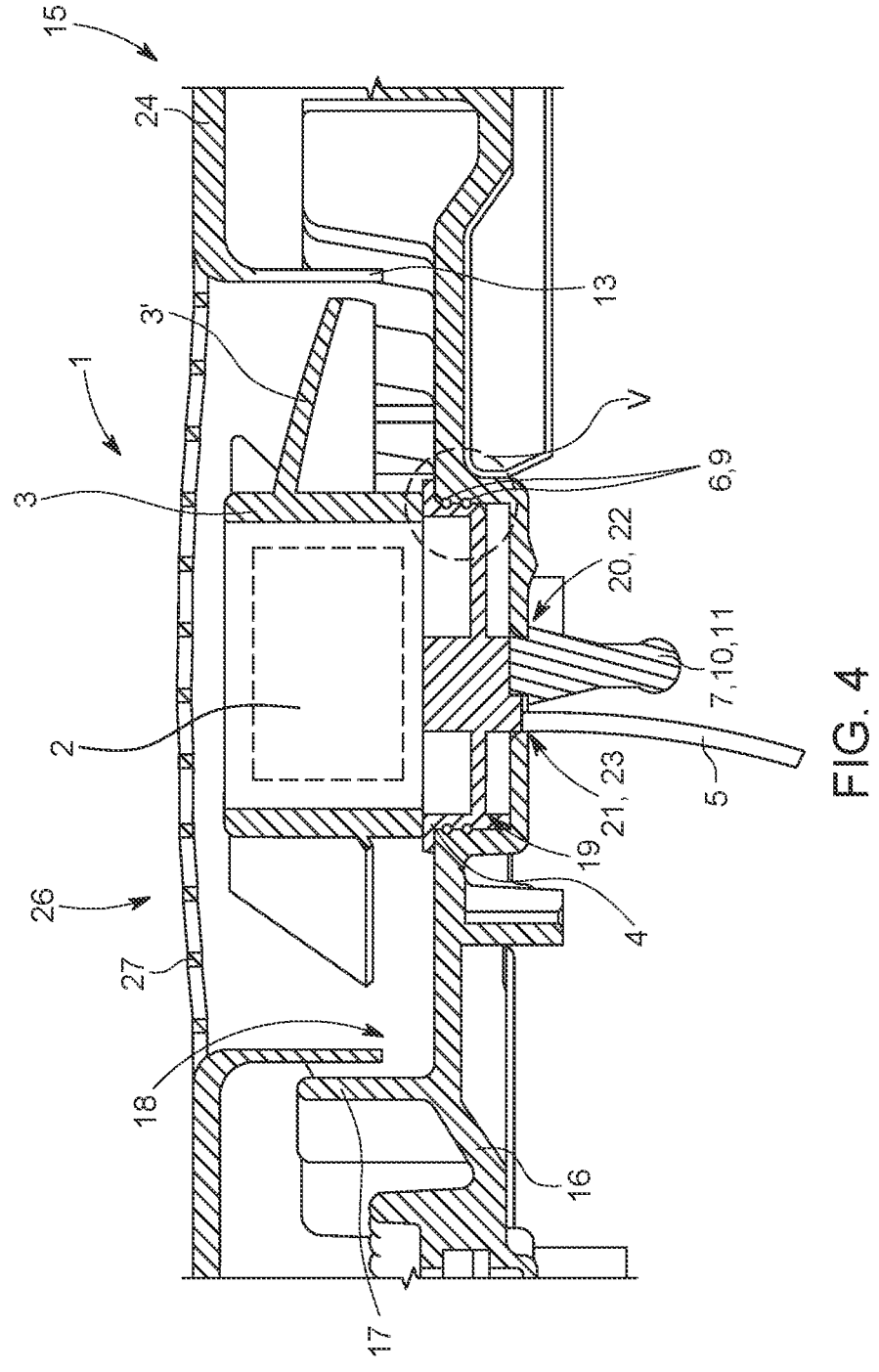
FIG. 4 shows a sectional view of a first embodiment of a cooling device according to the invention.

FIG. 4 shows a sectional view of a first embodiment of a cooling device 14 according to the invention. The motor housing 4 of the fan 1 has a peripheral seal 6 in the form of two O-rings 9 running in a groove 8 on the motor housing 4 (see FIG. 5, left-hand illustration). On the side of the motor housing 4 facing away from the rotor blades 3', the cable 5 for supplying the motor 2 of the fan 1 with electrical energy and a fastening element 7 are provided. This cable 5 is passed through a passage 21 in the recess 19 of the heat sink 16. This passage 21 is preferably formed by a bore 23 in the heat sink 16. In this embodiment, the motor housing 4 is cylindrical. Accordingly, the recess 19 in the cavity 18 of the heat sink 16 of the cooling device 14 is also cylindrical. When the motor housing 4 of the fan 1 is inserted into the recess 19, the fan 1 is automatically centered. In this embodiment of the fan, the fastening element 7 is implemented as a latching element 10, preferably an elastic latching pin 11. The recess 19 of the heat sink 16, the provides a receptacle 20 for the fastening element 7 in the form of a cylindrical recess 22. The elastic latching pin 11 is pulled through this cylindrical recess 22 to fasten the fan 1 to the heat sink 16. This enables a simple and quick tool-free attachment of the fan 1 to the heat sink 16. For disassembly, the elastic latching pin 11 is moved through the cylindrical recess 22 towards the motor housing 4, thus releasing the fan 1 from the heat sink 16.

An air guide ring 13 surrounding the rotor blades 3' of the fan 1 is used to guide the cooling air flow. The air guide ring 13 can be a separate part and can fastened in a suitable manner, for example snapped, to the heat sink 16, or can be connected to the housing front 24 of the housing 15 or can be integrated or co-manufactured in the housing front 24. In the latter case, the air guide ring 13 is automatically placed around the fan 1 when the housing 15 is closed, so that the cooling air flow can be correspondingly directed.

Figure 5:
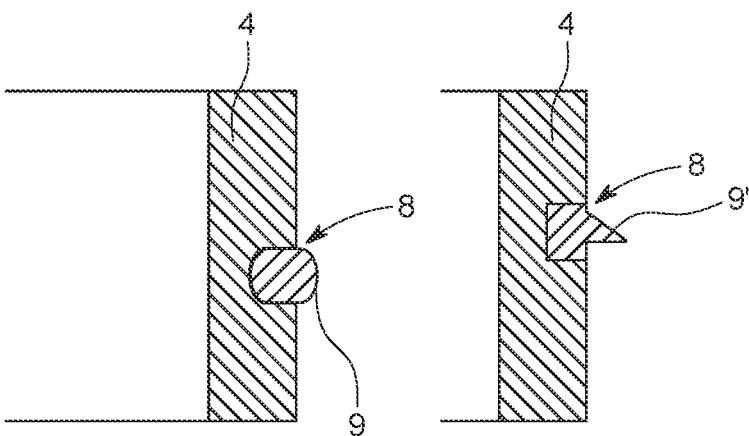
FIG. 5 shows a detailed view of the motor housing of the fan of the cooling device in the area of the seal in two different embodiment variants.

FIG. 5 shows a detailed view of the motor housing 4 of the fan 1 in the region of the seal 6 corresponding to the region V in FIG. 4 in two different embodiments. In the left-hand illustration, the seal 6 of the motor housing 4 of the fan is formed by an O-ring 9 running in a peripheral groove 8 of the motor housing 4. It is also possible for a plurality of O-rings 9 to be arranged next to one another or under one another in a plurality of grooves 8 in the motor housing 4 of the fan 1. In the embodiment shown in the right-hand part of FIG. 5, the seal 6 is formed by at least one lamellar seal 9' on the motor housing 4. The lamellar seal 9' can be arranged in a groove 8 or the like in the motor housing 4 or can also be produced directly with the motor housing, for example in a single-component or multi-component injection moulding process.

Figure 6:
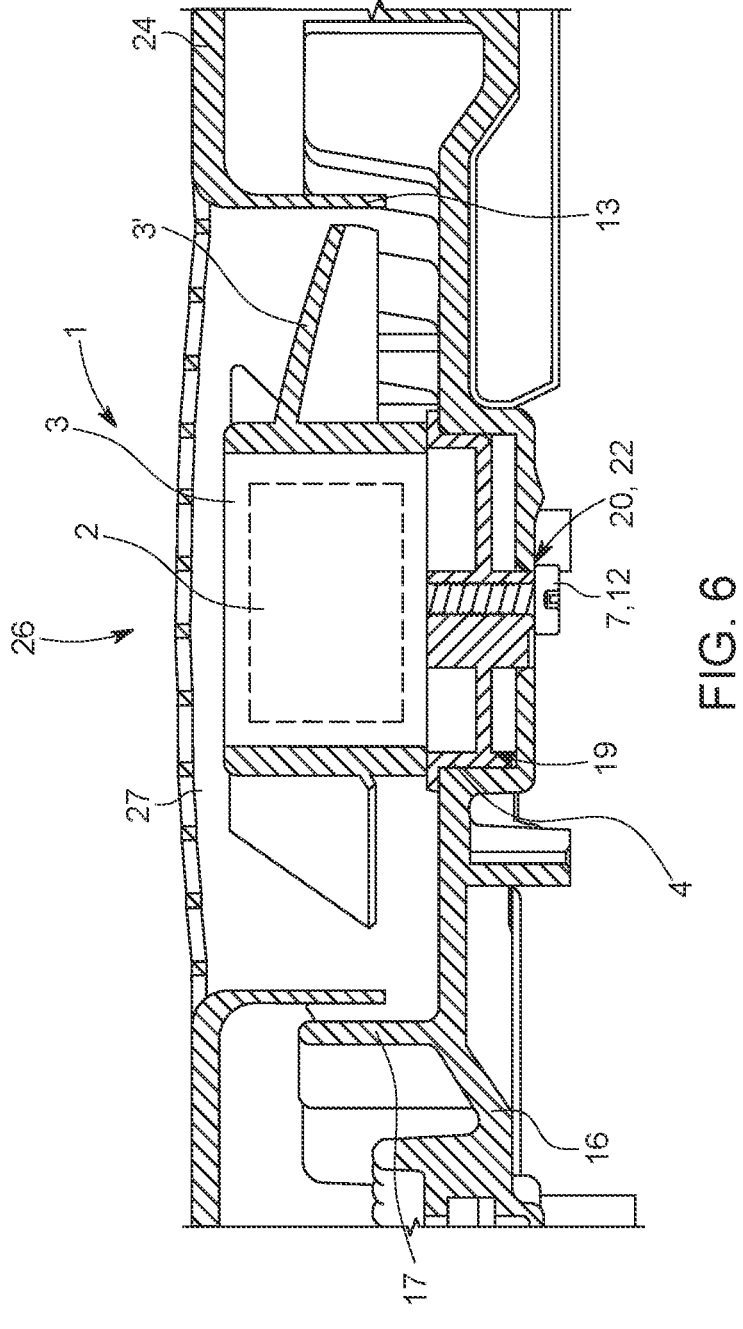
FIG. 6 shows a sectional view of a second embodiment of a cooling device according to the invention.

Finally, FIG. 6 shows a sectional view of a second embodiment of a cooling device 14 according to the invention. In contrast to the embodiment according to FIG. 4, in this case the fastening element 7 for fastening the motor housing 4 of the fan 1 to the heat sink 16 is formed by a fastening screw 12, which is screwed through the cylindrical recess 22 of the heat sink 16. In contrast to the variant according to FIG. 4, a tool is required here for fastening and disassembly the fan 1 on or from the heat sink 16.

FIG. 7 shows a side view of a fan 1 of the cooling device 14. The fan 1 has an electric motor 2 (not shown), a rotor 3 and rotor blades 3' non-rotatably connected to the rotor 3. The fan 1 also has a preferably cylindrical motor housing 4 and a cable 5 for supplying the motor 2 with electrical energy. The motor housing 4 has a peripheral seal 6, which is formed here by two O-rings 9. On the side of the motor housing 4 facing away from the rotor blades 3', the cable 5 and a fastening element 7 are arranged. In the embodiment of the fan 1 shown, the fastening element 7 is formed by an elastic latching pin 11.

Figure 8:
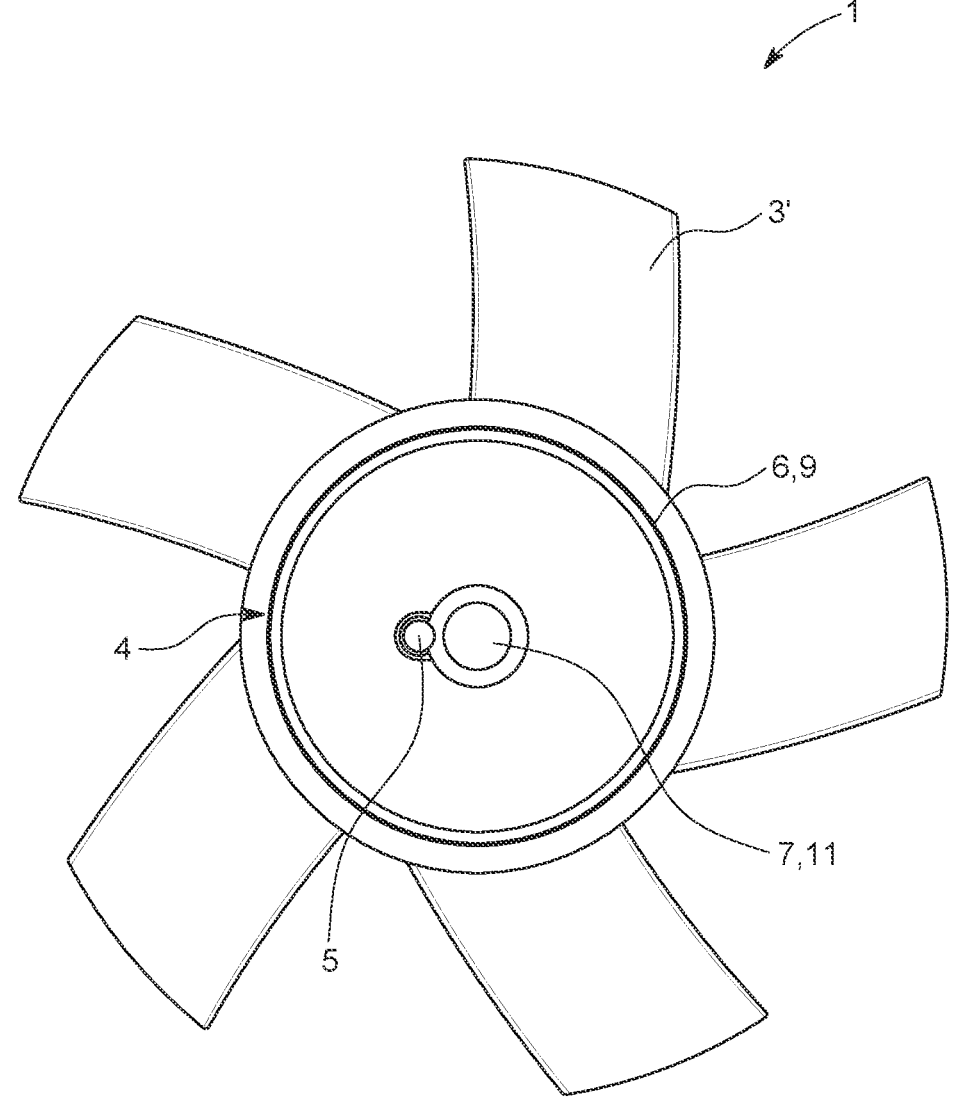
FIG. 8 shows a bottom view of the fan according to FIG. 7.

FIG. 8 illustrates a view from the bottom of the fan 1 according to FIG. 7. Here, the cylindrical motor housing 4 can be seen and the cable 5 arranged on the underside or the side facing away from the rotor blades 3' and the fastening element 7 formed as an elastic latching element 11 are shown.

In the cooling device 14 designed according to the invention (see FIG. 4), the fan 1 can be assembled particularly simply and quickly on the corresponding heat sink 16, and sweeping noises caused by fastening elements or the like are avoided or at least reduced.

The invention claimed is:

1. A cooling device (14) for cooling power electronic components arranged in a housing (15), comprising a heat sink (16) and a fan (1) having an electric motor (2) with a rotor (3) and rotor blades (3') non-rotatably connected to the rotor (3), wherein the motor (2) is arranged in a motor housing (4) and is connected to a cable (5) for the supply of electrical energy, and the heat sink (16) has a plurality of cooling fins (17) and a cavity (18) for receiving the fan (1), wherein a recess (19) arranged in the cavity (18) of the heat sink (16) receives the motor housing (4) of the fan (1), wherein the motor housing (4) of the fan (1) has a peripheral seal (6) and the cable (5) and a fastening element (7) are arranged on the side of the motor housing (4) facing away from the rotor blades (3'), wherein a receptacle (20) for the fastening element (7) and a passage (21) for the cable (5) are arranged in the recess (19).

2. The cooling device (14) according to claim 1, wherein the motor housing (4) of the fan (1) is cylindrical.

3. The cooling device (14) according to claim 1, wherein the seal (6) of the motor housing (4) of the fan (1) is formed by at least one O-ring (9) arranged in each case in a groove (8) on the motor housing (4).

4. The cooling device (14) according to claim 1, wherein the seal (6) of the motor housing (4) of the fan (1) is formed by at least one lamellar seal (9') on the motor housing (4).

5. The cooling device (14) according to claim 1, wherein the fastening element (7) is formed by a latching element (10).

6. The cooling device (14) according to claim 1, wherein the fastening element (7) is formed by a fastening screw (12).

7. The cooling device (14) according to claim 1, wherein the cable (5) is arranged next to the fastening element (7).

8. The cooling device (14) according to claim 1, wherein an air guide ring (13) surrounding the rotor blades (3') is provided.

9. The cooling device (14) according to claim 1, wherein the receptacle (20) for the fastening element (7) is formed by a cylindrical recess (22).

10. The cooling device (14) according to claim 1, wherein the passage (21) for the cable (5) is formed by a bore (23).

11. A housing (15) for receiving power electronic components, having a housing front (24) and at least one rear housing part (25), wherein the cooling device (14) according to claim 1 is provided behind the housing front (24), wherein an opening (26) for sucking in ambient air is arranged in the housing front (24).

12. The housing (15) according to claim 11, wherein a grille (27) is arranged in the opening (26) of the housing front (24).

13. The housing (15) according to claim 11, wherein the air guide ring (13) of the fan (1) is arranged in the housing front (24).

14. The cooling device (14) according to claim 1, wherein the fastening element (7) is formed by an elastic latching pin (11).

* * * * *